(12) United States Patent
Cmich et al.

(10) Patent No.: US 11,596,076 B2
(45) Date of Patent: **\*Feb. 28, 2023**

(54) SEALING SYSTEM FOR ELECTRONICS ENCLOSURE

(71) Applicant: MTD Products Inc, Valley City, OH (US)

(72) Inventors: Ryan Cmich, Sharon Township, OH (US); Joseph Saunders, Wadsworth, OH (US)

(73) Assignee: MTD PRODUCTS INC, Valley City, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/331,066

(22) Filed: May 26, 2021

(65) Prior Publication Data

US 2021/0282287 A1 Sep. 9, 2021

Related U.S. Application Data

(63) Continuation of application No. 16/274,412, filed on Feb. 13, 2019, now Pat. No. 11,051,417.
(Continued)

(51) Int. Cl.
*H05K 5/06* (2006.01)
*H05K 5/02* (2006.01)
(Continued)

(52) U.S. Cl.
CPC ............ *H05K 5/069* (2013.01); *H02G 3/083* (2013.01); *H02G 3/086* (2013.01); *H02G 3/088* (2013.01);
(Continued)

(58) Field of Classification Search
CPC .... H02G 3/088; H05K 5/0239; H05K 5/0247; H05K 5/069; H05K 5/0204; H05K 5/003; H01R 13/5205; B60R 16/0222
See application file for complete search history.

(56) References Cited

U.S. PATENT DOCUMENTS 5,567,916 A 10/1996 Napiorkowski et al.
6,492,590 B1 * 12/2002 Cheng ................ H01R 13/6658
52/27
(Continued)

FOREIGN PATENT DOCUMENTS

EP 1860748 A1 11/2007
EP 2216867 A2 8/2010
(Continued)

OTHER PUBLICATIONS

International Search Report and Written Opinion dated Apr. 4, 2019, received in International Application No. PCT/US2019/017760, 43 pages.
Examination Report dated Sep. 8, 2021, received in European Patent Application No. 19707257.2, 7pages.

*Primary Examiner* — James Wu
(74) *Attorney, Agent, or Firm* — Wegman Hessler (57) ABSTRACT

A sealing system for an electronics enclosure includes an enclosure having a first enclosure half and a second enclosure half, the first enclosure half including at least one sidewall, a multi-lip radial sealing member having a plurality of lip elements, the lip elements extending perpendicularly to the side wall, the radial sealing member being positioned between the first enclosure half and the second enclosure half such that the radial sealing member remains flush against the enclosure, and the lip elements form continuous points of contact around the perimeter of the enclosure.

17 Claims, 11 Drawing Sheets

Related U.S. Application Data

(60) Provisional application No. 62/630,338, filed on Feb. 14, 2018.

(51) Int. Cl.
  *H02G 3/08* (2006.01)
  *H02G 15/013* (2006.01)
  *H05K 5/03* (2006.01)

(52) U.S. Cl.
  CPC ......... *H02G 15/013* (2013.01); *H05K 5/0204* (2013.01); *H05K 5/0247* (2013.01); *H05K 5/03* (2013.01)

(56) References Cited

U.S. PATENT DOCUMENTS

| | | | |
|---|---|---|---|
| 7,445,490 B2* | 11/2008 | Jacobson | H01R 13/5205 439/465 |
| 11,051,417 B2* | 6/2021 | Cmich | H02G 3/083 |
| 2003/0000726 A1* | 1/2003 | Miyakoshi | H02G 3/088 174/650 |
| 2008/0083547 A1 | 4/2008 | Pinol Pedret et al. | |
| 2014/0252722 A1 | 9/2014 | Takao et al. | |
| 2016/0072266 A1 | 3/2016 | Bulancea | |

FOREIGN PATENT DOCUMENTS

| | | |
|---|---|---|
| JP | H06333433 A | 12/1994 |
| JP | 2001006467 A | 1/2001 |

* cited by examiner

SEALING SYSTEM FOR ELECTRONICS ENCLOSURE

CROSS REFERENCE TO RELATED APPLICATION

This application is a continuation of, and claims the priority filing benefit of, U.S. patent application Ser. No. 16/274,412 filed on Feb. 13, 2019, and U.S. Provisional Patent Application Ser. No. 62/630,338 filed Feb. 14, 2018, each of which are incorporated herein by reference in their entirety.

FIELD OF THE INVENTION

The disclosed technology relates generally to sealing systems for electronics enclosures, and in particular, but not exclusively to, sealing systems for electronics enclosures having cable entry points.

BACKGROUND OF THE INVENTION

In applications utilizing sensitive electrical components, it is sometimes required that these components are protected from damaging exposure to environmental contaminants such as dust, dirt, and water. Optimally, this is accomplished with a water-tight enclosure. In consumer products, this enclosure should be as low cost as possible and easily assembled. Additionally, it is common that there is a need for electrical conductors to pass through this enclosure to connect with the electronic components. These entry points must not provide a means for contaminants to enter the enclosure, and shall also be easily assembled in a manner suitable for mass production.

For consumer products, the optimum choice of material for electronics enclosures is thermoform and/or thermoset plastics due to their versatility and low cost. Conventionally, an effective method for sealing these plastic enclosures utilizes a silicone rubber seal captured in the overlap of two halves of the enclosure. These seals generally work well with plastic enclosures because they do not require the precision and high clamp forces of more common compression seals. Because there currently does not exist a practical means for providing for entry of cables at the enclosure separation area, through-wall entries are typically used. There are some cost effective means for sealing this type of cable entry, however, these sealing means are not always particularly reliable, and can present a restriction on the size of connectors that may be pre-installed on the ends of the cables, since the connectors generally must pass through an opening in the wall of the enclosure.

SUMMARY OF THE INVENTION

The disclosed technology generally described hereinafter provides for cable entry sealing system. According to one aspect of the disclosed technology, the cable entry sealing system comprises an enclosure having a first enclosure half and a second enclosure half, the first enclosure half comprising at least one sidewall having an aperture therein; a radial sealing member, the radial sealing member being positioned between the first enclosure half and the second enclosure half; and a cable entry positioned within the aperture, wherein the cable entry comprises: a cable grommet; and a cable grommet support groove.

In some embodiments, the radial sealing member provides a seal at the perimeter of the enclosure. In some embodiments, the radial sealing member comprises a multi-lip radial seal. In some embodiments, the multi-lip radial seal is provided in a singular, continuous loop. In some embodiments, the multi-lip radial seal allows for multiple contact points along the perimeter of the enclosure to provide a seal. In some embodiments, the multi-lip radial seal is in direct contact with the first enclosure half.

In some embodiments, the cable grommet comprises a first portion, the first portion having a first lip and a first lip face; and a second portion, the second portion having a second lip and a second lip face, wherein the second lip includes a projection extending beyond the first lip face, wherein a recess is formed between the first portion and the second portion. In some embodiments, the first portion and the second portion are generally U-shaped. In some embodiments, the cable grommet support groove is located within the sidewall of the first enclosure half.

In some embodiments, at least one sidewall further comprises an offset face, wherein the offset face engages with the projection, such that when the cable grommet is installed within the cable grommet support groove, the projection and the offset face form a contiguous portion of the sidewall. In some embodiments, the cable grommet support groove is shaped to receive and communicate with the cable grommet. In some embodiments, the cable entry further comprises a sealing face. In some embodiments, the recess and the sealing face are abuttingly engaged to form a cable entry seal. In some embodiments, the sealing face further comprises a knife edge.

In yet another aspect of the present technology, a cable entry sealing mechanism is provided. The cable entry sealing mechanism, comprises a cable grommet, comprising a first portion and a second portion, wherein the first portion comprises a first lip, the first lip having a first outer edge and a first lip face, wherein the second portion comprises a second lip, the second lip having a second outer edge, a second lip face, and a projection extending beyond the first lip face, wherein a recess is formed between the first portion and the second portion; and wherein the cable grommet is generally U-shaped.

In yet another aspect of the present technology, a cable entry sealing system is provided. The cable entry sealing system comprises an electronics enclosure having a first enclosure half and a second enclosure half, the first enclosure half comprising at least one sidewall having an aperture therein, wherein the enclosure defines an interior; a radial multi-lip seal, the radial multi-lip seal being positioned between the first enclosure half and the second enclosure half; and a cable entry positioned within the aperture, wherein the cable entry comprises: (1) a cable grommet, wherein the cable grommet is generally U-shaped, having a first portion and a second portion, wherein a recess is formed between the first portion and the second portion; and (2) a cable grommet support groove formed within the sidewall of the first enclosure half, wherein the cable grommet support groove is shaped to receive and communicate with the cable grommet.

In some embodiments, the cable entry sealing system further comprises a sealing face adjacent to the interior of the enclosure. In some embodiments, the recess and the sealing face are abuttingly engaged to form a cable entry seal. In some embodiments, the cable entry seal is a water-tight seal that is created by the cooperation between the recess and the sealing face. In some embodiments, the installation of the cable grommet allows for a gland profile to be completed, such that the radial multi-lip seal performs as though there was no aperture within the sidewall.

BRIEF DESCRIPTION OF SEVERAL VIEWS OF THE DRAWINGS

These and other features of the disclosed technology, and the advantages, are illustrated specifically in embodiments now to be described, by way of example, with reference to the accompanying diagrammatic drawings, in which.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawings and description are to be regarded as illustrative in nature and not as restrictive.

DETAILED DESCRIPTION OF THE EMBODIMENTS

The following terms are used throughout the description, the definitions of which are provided herein to assist in understanding various aspects of the subject disclosure.

As used herein, the term "electronics", refers to any of a printed circuit board assembly, power supply, battery, and most any electronic or electrical component or assembly.

As used herein, the terms "enclosure", "electronics enclosure", and "housing" are used interchangeably, and refer to any electronics enclosure in which electronic or electrical components are to be contained.

As used herein, the terms "aperture" and "cut-out" are used interchangeably, and refer to an opening or cut-out portion of the enclosure.

Figure 1:
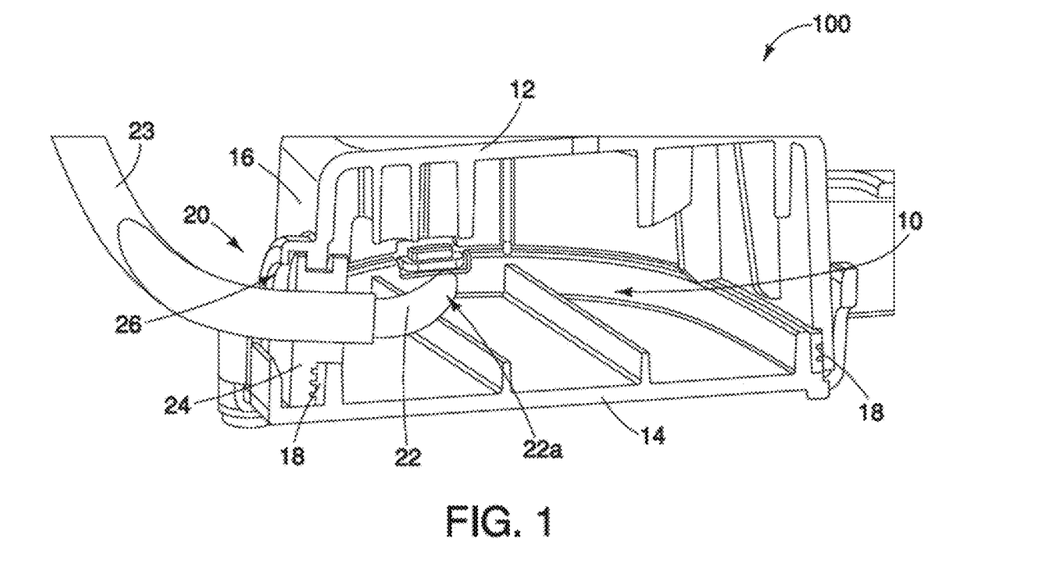
FIG. 1 is a cross-sectional side view of an illustrative embodiment of the disclosed technology.

The disclosed technology generally described hereinafter provides for cable entry sealing system. With reference to FIG. 1, a cable entry sealing system 100 is provided. The cable entry sealing system 100 provides for an electronics enclosure 10, comprising a first enclosure half 12 and a second enclosure half 14. The first enclosure half 12 is generally box-shaped and can be formed of any material sufficient to be rigid enough to adequately enclose the electronics housed therein. However, it should be understood that the first enclosure half 12 can be of any shape required to contain the desired electrical components within the enclosure 10.

The second enclosure half 14 is generally planar, e.g. a cover or lid. However, the second enclosure half 14 can be most any shape capable of effectively mating or combining with the first enclosure half 12 to form a complete enclosure 10. The second enclosure half 14 can be formed of material that is the same or different than that of the first enclosure half 12.

Figure 6:
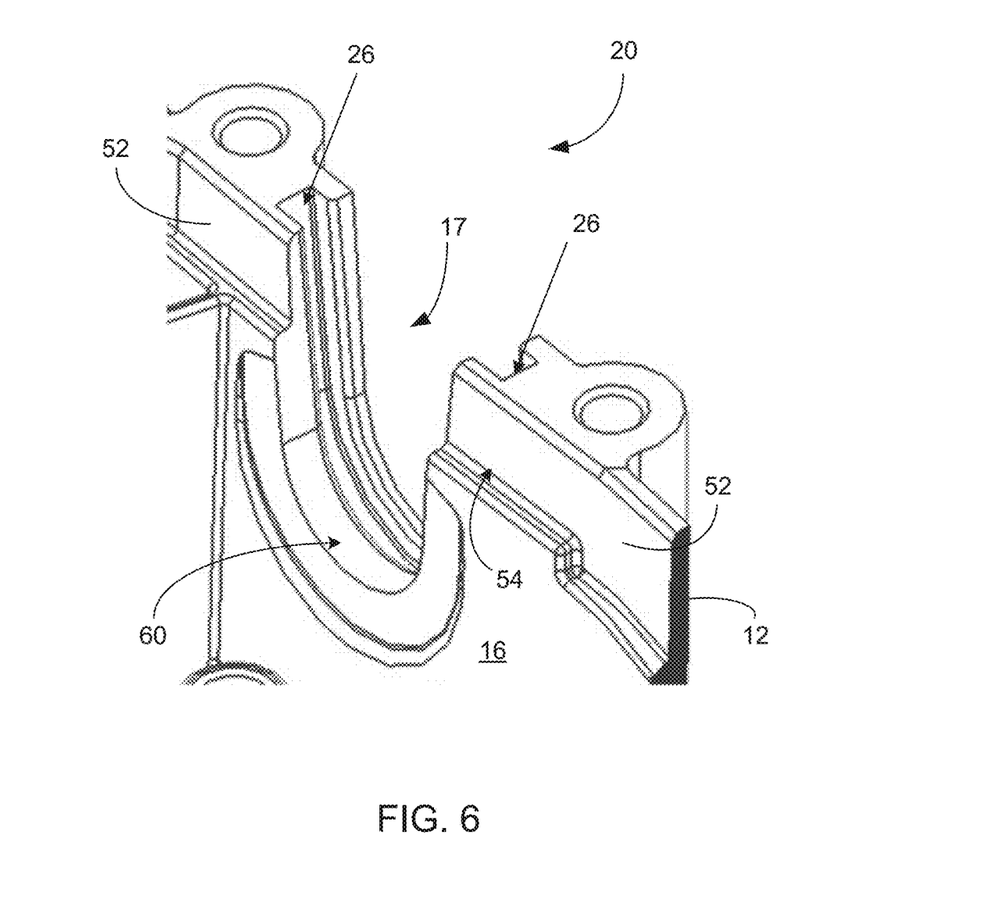
FIG. 6 is a side isometric view of an illustrative embodiment of the disclosed technology.

The first enclosure half 12 comprises at least one sidewall 16 having an aperture 17 located therein (shown in FIG. 6). The aperture 17 is formed from a cut-out portion of the sidewall 16. The aperture 17 allows for electrical conductors confined within a cable to pass through the wall of the enclosure 10.

As shown in FIG. 1, the enclosure 10 further comprises a sealing member 18 positioned between the first enclosure half 12 and the second enclosure half 14 to provide a seal. The sealing member 18 operates in a radial manner so as to seal along the perimeter of the enclosure 10. In some embodiments, the sealing member 18 can be formed of a single sealing material encompassing the perimeter of the enclosure 10. In some embodiments, the sealing member 18 is a multi-lip radial seal. In other embodiments, the sealing member 18 can be an o-ring, quad-ring, or other sealing means of similar elastomeric form.

Figure 2:
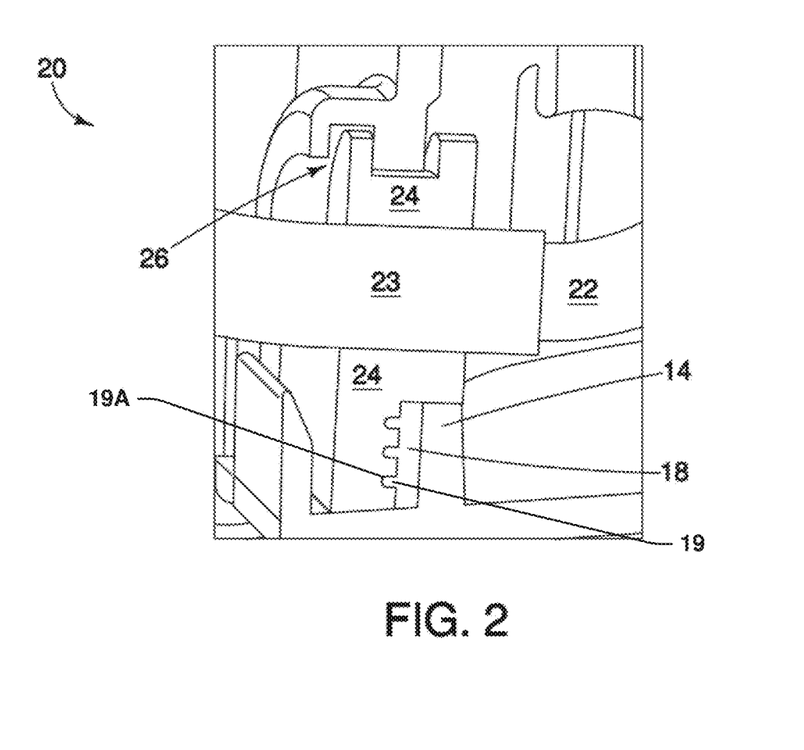
FIG. 2 is a schematic of an illustrative embodiment of the disclosed technology.

The cable entry sealing system 100 further comprises a cable entry 20. The cable entry 20 is positioned within the aperture 17 located in the sidewall 16. As shown in FIGS. 1 and 2, the cable entry 20 comprises a cable 22, a cable grommet 24, and a cable grommet support groove 26. In some embodiments, the cable 22 is further encompassed by a cable jacket 23. The cable 22 and the cable jacket 23 extend from the exterior of the enclosure 10, passing through the cable grommet 24 to access the interior of the enclosure 10. The cable 22 includes a distal end 22a which terminates within the enclosure 10, and can include connectors or terminals (not shown) for electrically and physically connecting to, for example, a printed circuit board or terminal block within the enclosure 10.

In some embodiments, the cable jacket 23 is fused to the cable grommet 24, where sealing between the cable grommet 24 and the cable 22 is accomplished by fusing the cable grommet 24 with the cable jacket 23 utilizing, for example, a plastic over-mold process. A plastic injection molding process can be utilized in which the cable grommet 24 is molded over the cable jacket 23 to provide a seal between the cable grommet 24 and the cable jacket 23. In an embodiment, the cable grommet 24 is molded over the cable 22 to provide a seal between the cable grommet 24 and the cable 22. The seal between the cable grommet 24 and the cable 22 and/or the cable jacket 23 can be impermeable, water-tight, air-tight, and/or water-resistant.

In some embodiments, the cable entry 20 can anchor the cable 22 to the enclosure 10, and provides an integrated strain relief feature which prevents mechanical forces applied at the exterior of the cable from being transferred to electrical terminations at the distal end 22a of the cable 22 within the enclosure 10, and helps to preserve the electrical and mechanical integrity of the cable 22.

Figure 3:
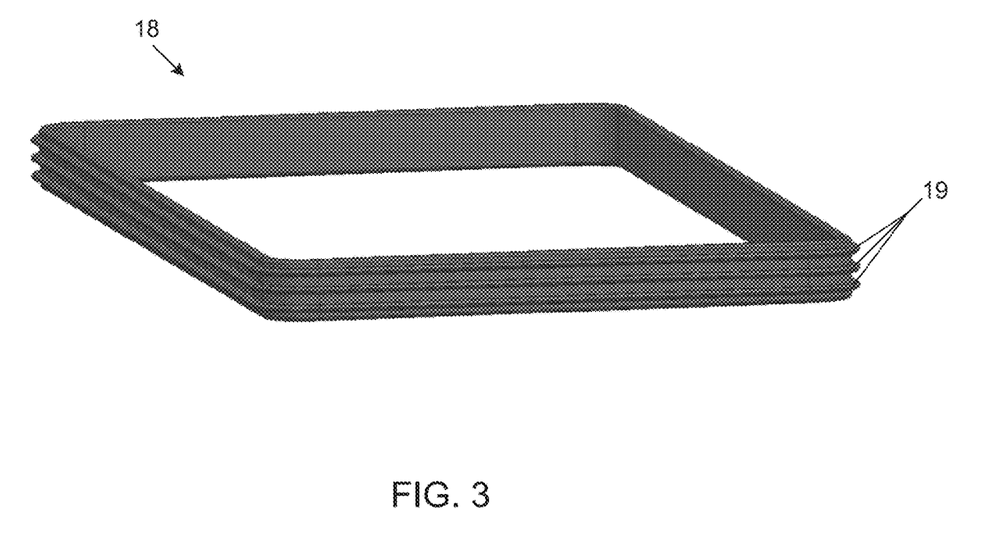
FIG. 3 is a schematic of an illustrative embodiment of the disclosed technology.
Figure 8:
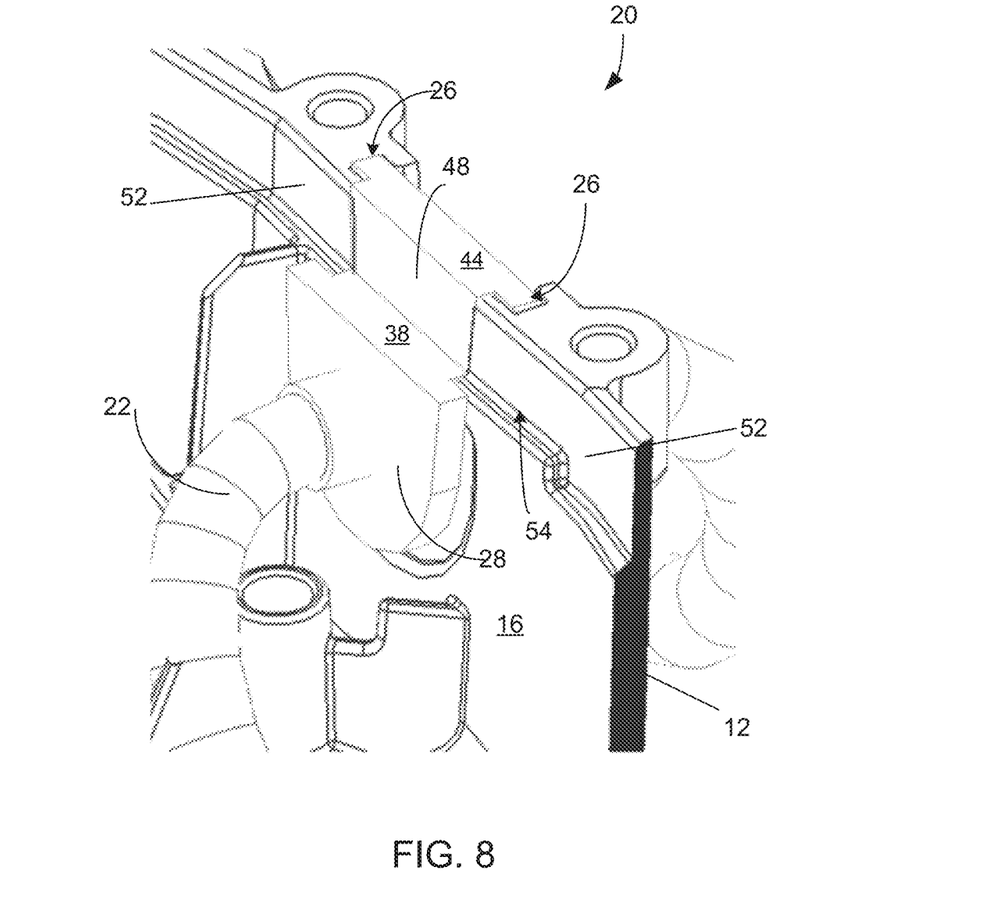
FIG. 8 is a side isometric view of an illustrative embodiment of the disclosed technology.

With reference to FIG. 3, in some embodiments, the sealing member 18 is a multi-lip radial seal. In some embodiments, the multi-lip radial seal is provided in a singular, continuous loop (as shown in FIG. 3). The sealing member 18 provides sealing or other lip elements 19, wherein such sealing or other lip elements 19 can be in direct contact with the first enclosure half 12, (as best shown in FIG. 8). The sealing member 18 or multi-lip radial seal allows for multiple contact points along the perimeter of the enclosure 10 thus providing a seal. It should be understood by one skilled in the art that the sealing member 18 can be comprised of any elastic or other compliant material that allows for the transitions included along the perimeter of the enclosure 10 and/or the cable grommet 24, yet still providing compression.

Figure 4:
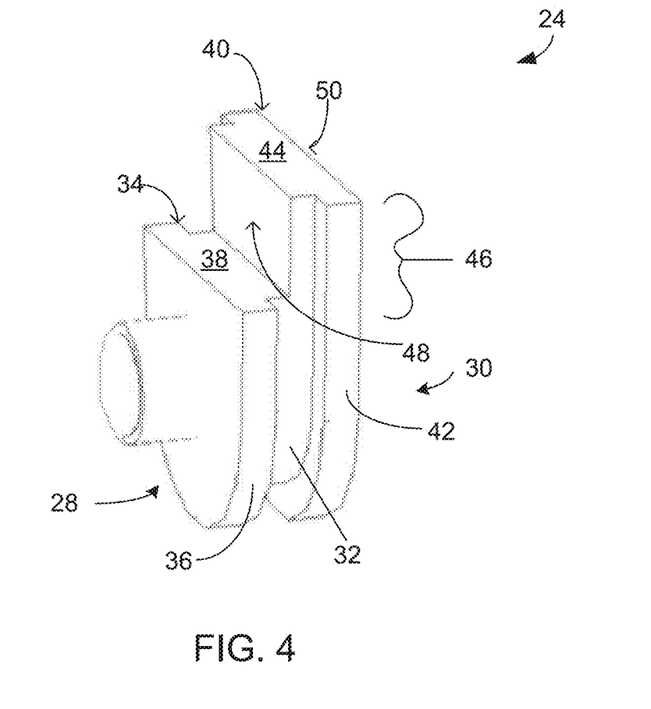
FIG. 4 is a side isometric view of an illustrative embodiment of the disclosed technology.

With reference to FIG. 4, the cable grommet 24 is shown. The cable grommet has a first portion 28 and a second portion 30. In some embodiments, the first portion 28 and second portion 30 are generally U-shaped, where a recess 32 is formed therebetween. The cable grommet 24 can be formed by the molding of a soft or compliant material. In some embodiments, the cable grommet 24 is formed of thermoplastic elastomer or flexible material. It should be understood by one skilled in the art that the cable grommet 24 can be made of any material sufficiently compliant to adequately form a water-tight seal.

The cable grommet 24 is generally shaped to fit tightly within the aperture 17. In some embodiments, the cable grommet 24 is molded as a single piece. In other embodiments, the cable grommet 24 can be formed of two molded pieces mated together to form a single piece.

Figure 5:
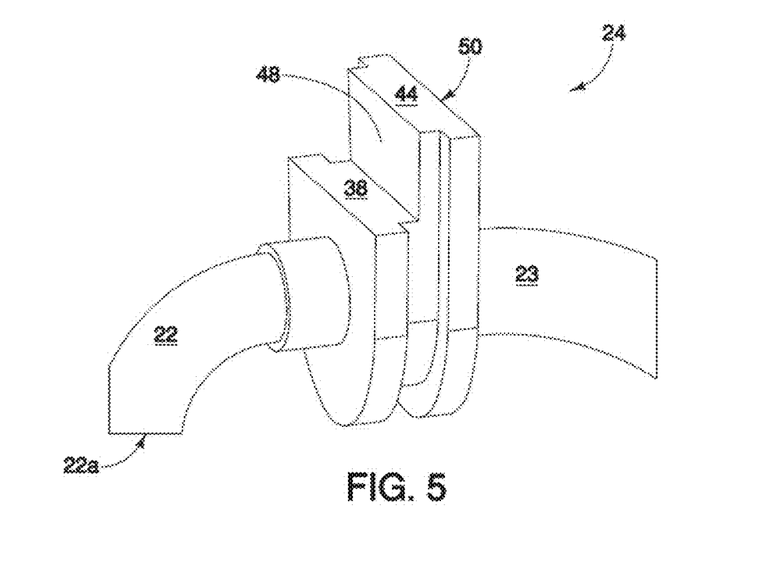
FIG. 5 is a schematic of an illustrative embodiment of the disclosed technology.

As shown in FIGS. 4 and 5, the cable grommet 24 includes a first portion 28 having a first lip 34, where the first lip 34 includes an outer edge 36 and a first lip face 38. The cable grommet second portion 30 includes a second lip 40, where the second lip 40 includes an outer edge 42, a second lip face 44, and a projection 46 extending beyond the first lip face 38. The projection 46 includes an interior surface 48 and an opposing exterior surface 50. The first lip face 38 and the interior surface 48 of the projection 46 converge to form a right angle. As shown in FIG. 5, the cable jacket 23 extends from the second portion 30 through the first portion 28, where the distal end 22a of the cable 22 terminates within the interior of the housing.

Figure 7A:
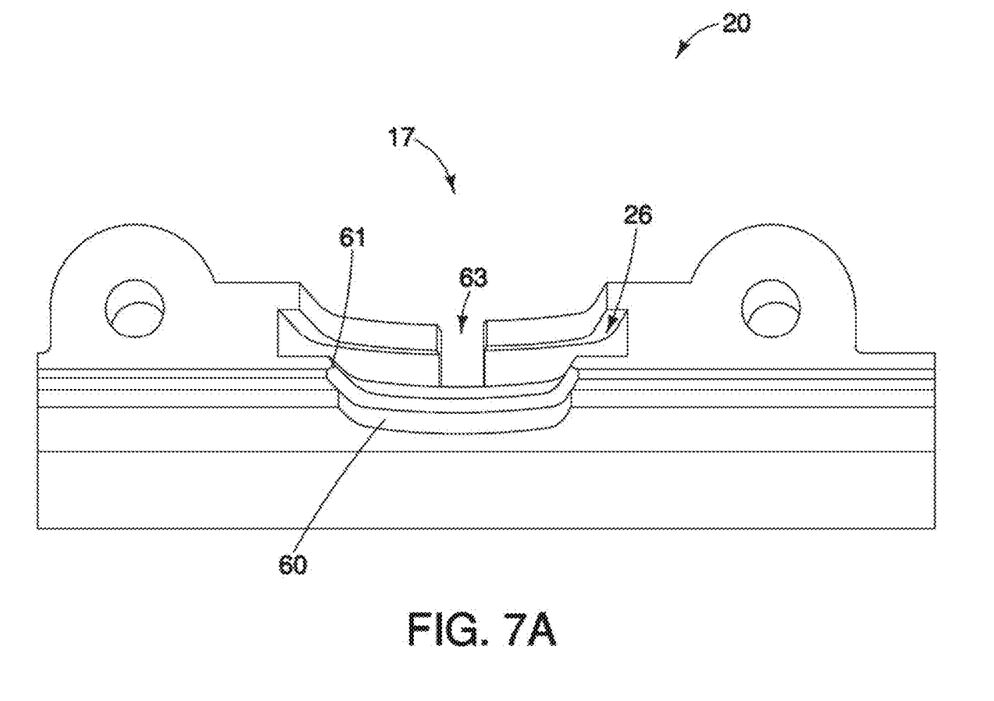
FIGS. 7A-7B provide a schematic of illustrative embodiments of the disclosed technology.
Figure 7B:
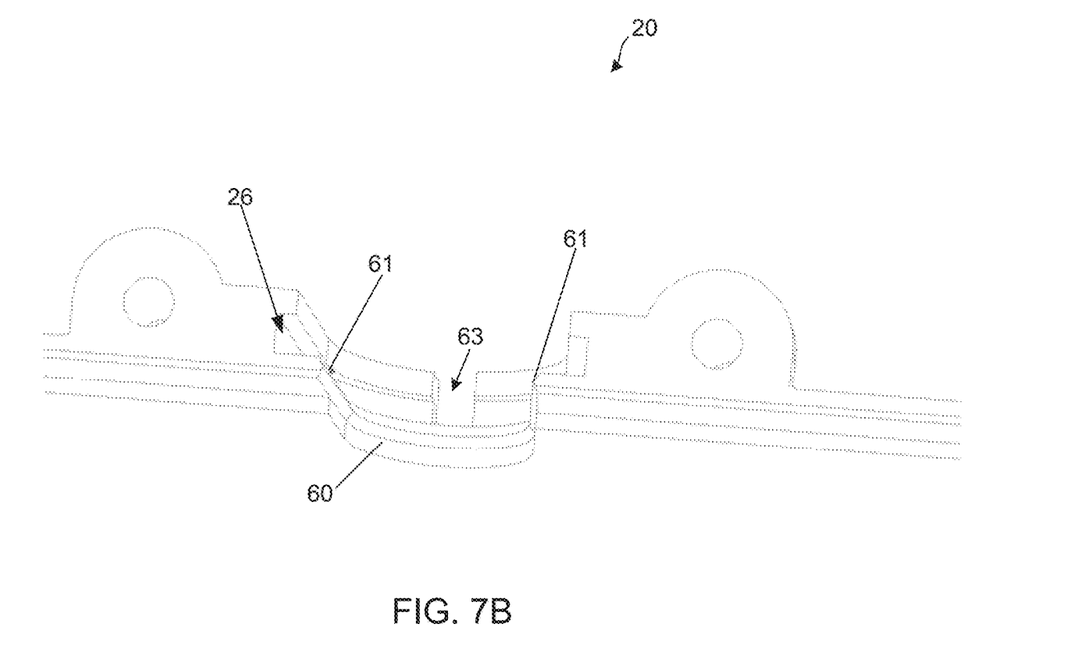

With reference to FIG. 6, the cable grommet support groove 26 is shown. The cable grommet support groove 26 is located within the sidewall 16 of the first enclosure half 12, and essentially frames the aperture 17. By framing or contouring the aperture 17, the cable grommet support groove 26 positions the flexible cable grommet 24 in the correct and proper location to ensure reliable assembly of the first enclosure half 12 and the second enclosure half 14. In some embodiments, the cable grommet support groove 26 comprises an optional cutout 63 (as shown in FIGS. 7A-7B), which allows for water drainage on the outside of the cable grommet 24. This optional cutout 63 prevents water from becoming trapped against or within the cable grommet support groove 26, and thus reduces the likelihood of penetration of water into the enclosure 10.

As shown in FIGS. 6-8, the cable grommet support groove 26 can be generally U-shaped, and shaped to receive and communicate with the cable grommet 24 to complete the sidewall 16. The sidewall 16 further includes an offset face 52 having a ledge 54. The offset face 52 correlates with the projection 46 of the cable grommet second portion 30 when the cable grommet 24 is installed. More specifically, and as shown in FIG. 8, the offset face 52 engages with the interior surface 48 of the projection 46, such that when the cable grommet 24 is installed within the cable grommet support groove 26, the interior surface 48 and the offset face 52 form a contiguous portion of the sidewall 16.

In some embodiments, the offset face 52 is offset inwardly toward the interior of the enclosure so to create the ledge 54 which works to prevent the sealing member 18 from sliding down and falling out of the gland. The first lip face 38 of the first portion 28 abuttingly engages with the ledge 54, such that when the cable grommet 24 is installed, the first lip face 38 and the ledge 54 form a contiguous portion.

Referring to FIGS. 6 and 7, the cable entry 20 further comprises a sealing face 60. The sealing face 60 is located on the interior side of the enclosure 10. It should be understood that the width of the sealing face 60 can be widened in order to improve sealing capability. The aperture 17 is sized so that a compressive force is maintained with the recess 32 (as shown best in FIG. 4), which increases the dimensional interference as the cable grommet 24 is pressed within the grommet support groove 26. It should be understood that the aperture 17 can be of any size that complements the size and shape of the cable grommet 24.

As shown in FIGS. 7A-7B, in some embodiments, the sealing face 60 further comprises a triangular cross-section or raised knife edge 61. The raised knife edge 61 extends over the length of or the perimeter of the sealing face 60. When the cable grommet 24 is installed, this triangular cross-section or knife edge 61 pushes against the cable grommet 24 to provide an increase in localized pressure (or increased compression), which improves sealing.

Figure 9:
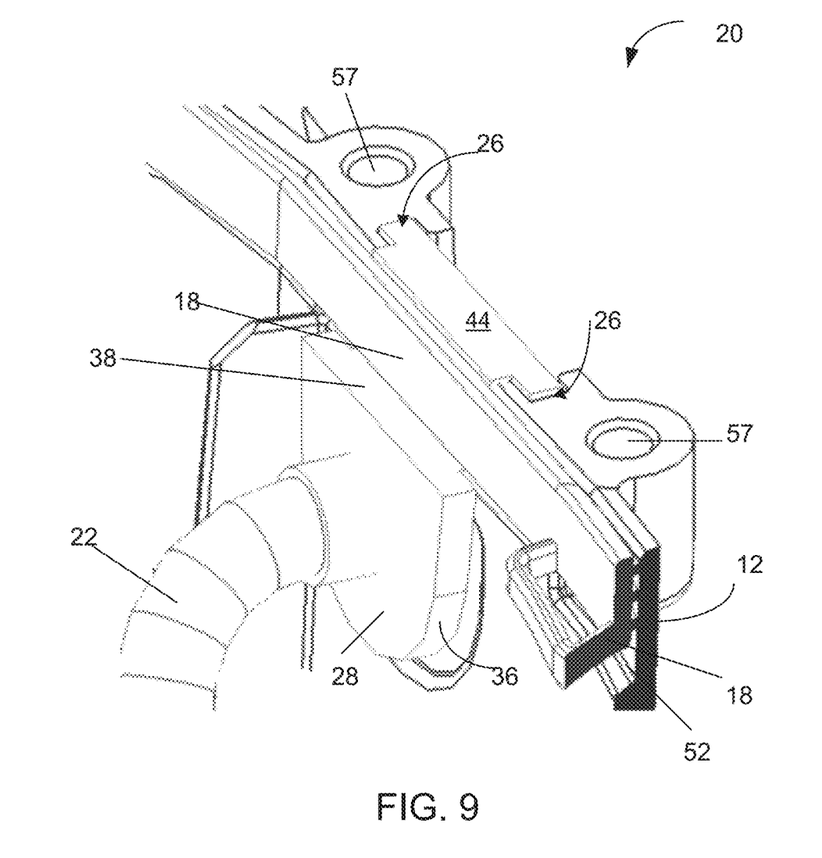
FIG. 9 is a side isometric view of an illustrative embodiment of the disclosed technology.
Figure 10:
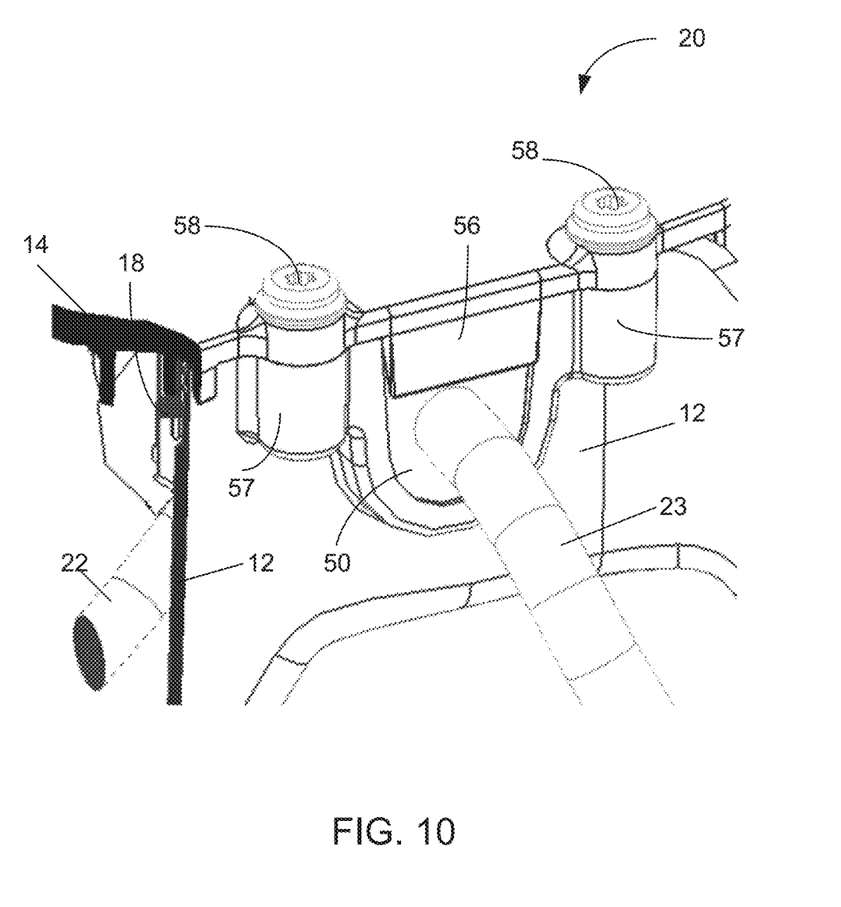
FIG. 10 is a front isometric view of an illustrative embodiment of the disclosed technology.

With reference to FIGS. 8-10, when the cable grommet 24 is properly installed, the recess 32 and the sealing face 60 are abuttingly engaged to form a seal between the grommet and the enclosure housing. The cable grommet support groove 26 cooperates with the cable grommet 24 to receive and engage with the outer edge 42 of the second portion 30, which ensures that the recess 32 and the sealing face 60 remain abuttingly engaged. Once the cable grommet 24 has been properly installed, the sealing member 18 can be provided (as shown in FIG. 9). The sealing member 18 abuttingly engages the offset face 52 and the interior surface 48 of the projection, and is adjacent to the ledge 54 (not shown in FIG. 9) and the first lip face 38. When installed, the sealing member 18 remains flush against the housing, sealing itself against the offset face 52 and the interior surface 48 of the projection.

In the presently disclosed cable entry sealing system 100, the connection between the recess 32 of the cable grommet 24 and the sealing face 60 (not shown in FIG. 9) provides for a water-tight seal and/or a seal that can prevent environmental contaminants from entering the enclosure 10. The sealing member 18 utilizes a plurality of flexible ribs (or sealing elements 61 as shown in FIG. 3), which create a high compliant interface that can conform to surface variances that may be present in the offset face 52 and the interior surface 48. The unique shape of the cable grommet 24 allows for the gland profile to be completed, and the sealing member 18 can perform as though there was no aperture 17 or cutout within the sidewall 16 of the first enclosure half 12.

Figure 11:
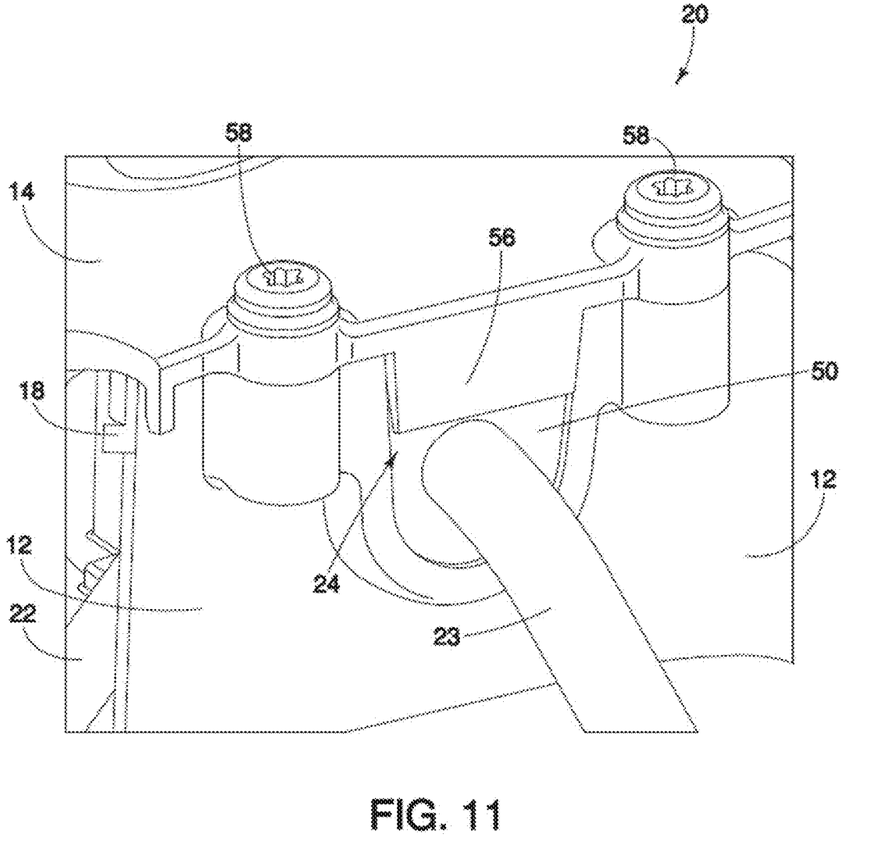
FIG. 11 is a schematic of an illustrative embodiment of the disclosed technology.

With reference to FIGS. 9-11, the fully assembled cable entry 20 is shown. In some embodiments, the first enclosure half 12 comprises at least one fastener receptacle 57. As shown in FIG. 9, two fastener receptacles 57 are shown. Each fastener receptacle 57 receives a fastener 58 to engage the first enclosure half 12 with the second enclosure half 14 to essentially form the complete electronics enclosure 10. In some embodiments, the fastener can be selected from a screw, bolt, or the like. The fasteners 58 allow for compression against the second lip face 44 to press the cable grommet 24 tightly in the aperture 17, thus ensuring a seal between the recess 32 and the sealing face 60.

In an embodiment, the cable grommet 24 is formed of a compliant material, which is ideal for sealing the enclosure 10. However, the relatively soft material can present challenges when it comes to maintaining the location and flatness of interior surface 48. To overcome this issue, a grommet support 56 is provided to reinforce and maintain the geometry of the grommet 24, and to ensure reliable engagement between the sealing member 18 or multi-lip seal and interior surface 48.

Figure 12:
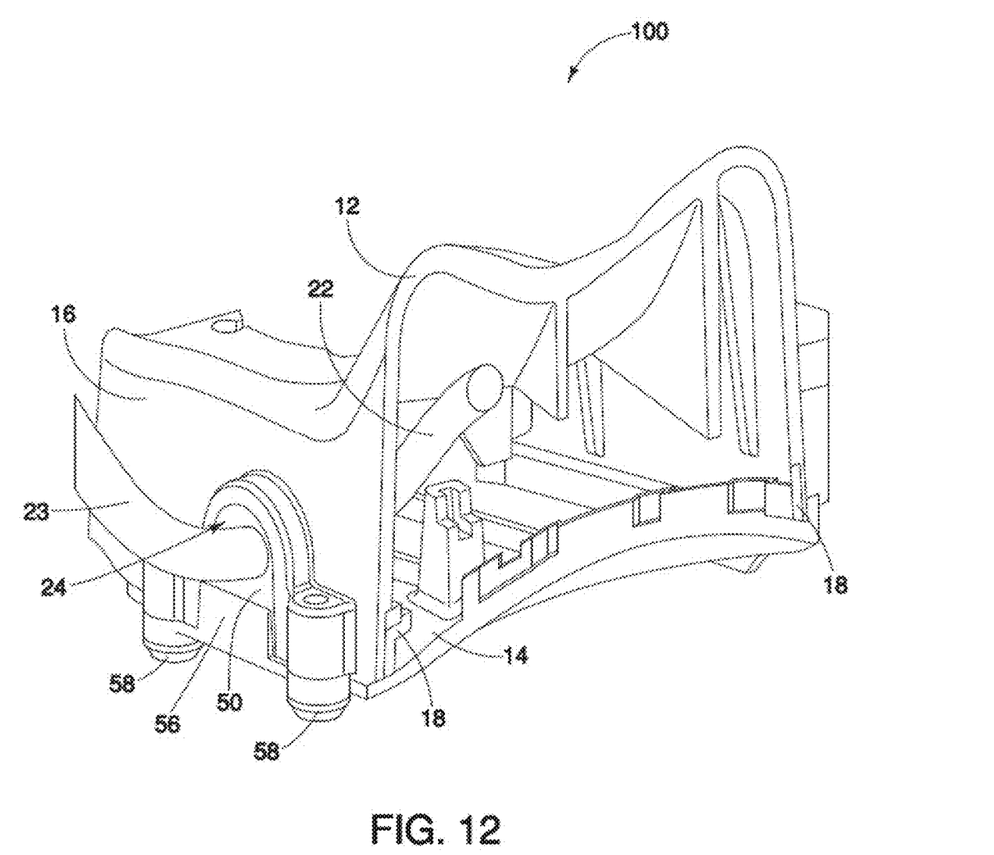
FIG. 12 is a schematic of an illustrative embodiment of the disclosed technology.

As shown in FIGS. 10-12, the grommet support 56 provides additional support to the cable grommet 24 when installed. The grommet support 56 is an additional feature provided by, and located on, the second enclosure half 14. When the electronics enclosure 10 is fully assembled, the grommet support 56 abuttingly engages with the exterior surface 50 of the projection 46 to provide a backing. As such, the grommet support 56 maintains reliable engagement of the cable grommet 24 with the sealing member 18 to effectively supply a waterproof or water-tight electronics enclosure 10.

While embodiments of the disclosed technology have been described, it should be understood that the present disclosure is not so limited and modifications may be made without departing from the disclosed technology. The scope of the disclosed technology is defined by the appended claims, and all devices, processes, and methods that come within the meaning of the claims, either literally or by equivalence, are intended to be embraced therein.

The invention claimed is:

1. A sealing system for an electronics enclosure, comprising:
    an enclosure having a first enclosure half and a second enclosure half, the first enclosure half comprising at least one sidewall;
    a radial sealing member comprising a multi-lip radial seal including a plurality of lip elements, wherein the lip elements extend perpendicularly to the at least one sidewall, the radial sealing member being positioned between the first enclosure half and the second enclosure half, wherein the radial sealing member remains flush against the enclosure, and wherein the lip elements form continuous points of contact around a perimeter of the enclosure; and
    a cable entry positioned within an aperture of the first enclosure half, wherein the cable entry comprises:
        a cable grommet comprising a plurality of lip element receiving portions, wherein the lip element receiving portions and the lip elements provide an interlocking seal between the cable grommet and the sealing member.

2. The sealing system for the electronics enclosure of claim 1, wherein the radial sealing member provides a seal around the perimeter of the enclosure.

3. The sealing system for the electronics enclosure of claim 1, wherein the multi-lip radial seal is a singular, continuous loop.

4. The sealing system for the electronics enclosure of claim 1, wherein the multi-lip radial seal is in direct contact with the first enclosure half.

5. The sealing system for the electronics enclosure of claim 1, wherein the plurality of lip element receiving portions are disposed in one-to-one correspondence with the plurality of lip elements.

6. The sealing system for the electronics enclosure of claim 5, wherein the cable grommet comprises:
    a first portion, the first portion having a first lip and a first lip face; and
    a second portion, the second portion having a second lip and a second lip face, wherein the second lip includes a projection extending beyond the first lip face, wherein a recess is formed between the first portion and the second portion.

7. The sealing system for the electronics enclosure of claim 6, wherein the first portion and the second portion are generally U-shaped.

8. The sealing system for the electronics enclosure of claim 5, comprising a cable grommet support groove located within the at least one sidewall of the first enclosure half.

9. The sealing system for the electronics enclosure of claim 8, wherein the at least one sidewall further comprises an offset face, wherein the offset face engages with the projection, such that when the cable grommet is installed within the cable grommet support groove, the projection and the offset face form a contiguous portion of the at least one sidewall.

10. The sealing system for the electronics enclosure of claim 8, wherein the cable grommet support groove is shaped to receive the cable grommet.

11. A cable entry sealing system, comprising:
    an electronics enclosure having a first enclosure half and a second enclosure half, the first enclosure half comprising at least one sidewall having an aperture therein, wherein the electronics enclosure defines an interior;
    a radial multi-lip seal including a plurality of lip elements, wherein the lip elements extend perpendicularly to the at least one sidewall, the radial multi-lip seal being positioned between the first enclosure half and the second enclosure half, wherein the radial multi-lip seal remains flush against the electronics enclosure; and
    a cable entry comprising a cable grommet positioned within the aperture of the first enclosure half, wherein the cable grommet comprises a plurality of lip element receiving portions, and wherein the lip element receiving portions and the lip elements provide an interlocking seal between the cable grommet and the radial multi-lip seal.

12. The cable entry sealing system of claim 11, wherein the plurality of lip element receiving portions are disposed in one-to-one correspondence with the plurality of lip elements.

13. The cable entry sealing system of claim 11, comprising a cable grommet support groove formed within the at least one sidewall of the first enclosure half, wherein the cable grommet support groove is shaped to receive the cable grommet.

14. The cable entry sealing system of claim 11, wherein the cable grommet is generally U-shaped, having a first portion and a second portion, and wherein a recess is formed between the first portion and the second portion.

15. The cable entry sealing system of claim 14, further comprising a sealing face adjacent to the interior of the electronics enclosure.

16. The cable entry sealing system of claim 15, wherein the recess and the sealing face are abuttingly engaged to form a cable entry seal.

17. The cable entry sealing system of claim 16, wherein the cable entry seal comprises a water-tight seal provided by the arrangement of the recess and the sealing face.

* * * * *